(12) United States Patent
Choi et al.

(10) Patent No.: US 6,424,225 B1
(45) Date of Patent: Jul. 23, 2002

(54) POWER AMPLIFIER CIRCUIT FOR PROVIDING CONSTANT BIAS CURRENT OVER A WIDE TEMPERATURE RANGE

(75) Inventors: Kevin Choi, Thousand Oaks; Nick Cheng, Simi Valley, both of CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/722,772

(22) Filed: Nov. 27, 2000

(51) Int. Cl.$^7$ ................................................ H03F 3/04
(52) U.S. Cl. ...................... 330/289; 330/296; 327/513; 323/312
(58) Field of Search ................................ 330/285, 288, 330/289, 296; 327/513, 538, 539, 362, 543; 331/57; 323/312, 315

(56) References Cited

U.S. PATENT DOCUMENTS 4,727,269 A * 2/1988 Luich ........................... 307/530
6,052,032 A * 4/2000 Jarvinen ...................... 330/289
6,297,685 B1 * 10/2001 Ewen et al. ................. 327/513
6,297,709 B1 * 10/2001 Wey et al. ................... 333/17.1

* cited by examiner

*Primary Examiner*—Benny Lee
*Assistant Examiner*—Henry Choe
(74) *Attorney, Agent, or Firm*—Thomas, Kayden, Hostemeyer & Risley, L.L.P.

(57) ABSTRACT

A temperature stable bias circuit for a radio frequency (RF) power amplifier uses current deletion and current supplement techniques to maintain the bias, or reference current of the RF power amplifier at a stable level regardless of the temperature that the power amplifier is operating. When temperature increases, the current deletion circuitry reduces the bias current supplied to the power transistor. When the temperature decreases, the current supplement circuitry increases the bias current supplied to the power transistor. This bias circuitry allows the output of the RF power amplifier to remain constant. The current deletion and current supplement circuitry can be fabricated using the same processing technology as the power amplifier and can be easily integrated into the power amplifier device packaging.

9 Claims, 4 Drawing Sheets

POWER AMPLIFIER CIRCUIT FOR PROVIDING CONSTANT BIAS CURRENT OVER A WIDE TEMPERATURE RANGE

BACKGROUND OF THE INVENTION

1. Technical Field

This invention relates generally to improving the efficiency of radio frequency power amplification in a wireless communication device transmitter, and more particularly, to a power amplifier circuit for providing constant bias current over a wide temperature range.

2. Related Art

With the increasing availability of efficient, low cost electronic modules, mobile communication systems are becoming more and more widespread. For example, there are many variations of communication schemes in which various frequencies, transmission schemes, modulation techniques and communication protocols are used to provide two way voice and data communications in a handheld telephone-like communication handset. While the different modulation and transmission schemes each have advantages and disadvantages, one common factor is the need for highly efficient power amplification. As these communication devices become smaller and smaller, the functionality provided by these devices continues to increase. One major concern when developing these handheld communication devices is power consumption. As the devices become smaller and smaller, the need to manage the amount of power consumed and dissipated becomes more and more critical. High efficiency power amplification decreases the amount of power consumed, thus maximizing the life of the power source of the device.

Most wireless power amplifier applications require high efficiency, gain and linearity over a broad range of operating temperatures. Because these features are typically difficult to achieve in the power amplification circuitry, additional circuitry and logic are required to achieve these goals.

Bias circuitry, that is typically present in power amplification circuits, is used to provide a "reference current" to the radio frequency (RF) power amplification device. A reference device, that can be for example but not limited to, a reference amplifier implemented using one or more transistors, provides the reference current. Th reference current is multiplied to generate a proper bias current for the RF amplification device. Unfortunately, the reference current fluctuates with temperature, resulting in undesirable performance variations in the RF power amplification device due to variations in the reference current caused by the temperature fluctuations.

FIG. 1 is a schematic view illustrating a conventional bias circuit for a radio frequency (RF) power amplifier. Power amplifier circuit 100 includes reference transistor 106 (designated "$Q_{REF}$") through which a reference current flows. The reference current flows from the voltage source $V_{REF}$ through resistor 102 into the collector terminal 104 of reference transistor 106. The reference current then flows through the emitter terminal 108 to ground. The reference current also flows through connection 112 and through connection 110 to buffer circuitry 114. Connection 112 connects the base terminal 110 of the reference transistor 106 to the collector terminal 104 of reference transistor 106. The reference current then flows through buffer circuitry 114 to the base terminal 116 of power transistor 122. This reference current, sometimes referred to as the bias current, present at the base terminal 116 of power transistor 122 regulates the flow of current from the node $V_{CC}$ (RF OUT)through power transistor 122.

In operation, an RF input signal is applied to node 118 labeled "RF IN" through capacitor 120 to the base terminal 116 of power transistor 122. The RF signal is then amplified by power transistor 122 as a function of the current flowing through the power transistor 122. The buffer circuitry 114, the detail of which has been omitted for simplicity, includes additional circuitry that allows the low beta transistors 106 and 122, each of which have high base currents, to support those high base currents. In this manner, the buffer circuitry 114 supplies the base current required by the power transistor 122. In addition, the buffer circuitry 114 includes circuitry that prevents the RF signal applied to node 118 from coupling back into the bias circuitry 130, and in particular, from adversely affecting the reference transistor 106. The output of the power transistor 122 is taken from the collector 124 at the node labeled "RF OUT." The current flowing in the collector 124 is defined as $I_R N = *I_{REF}$, where N is a multiplication factor, or ratio, between reference transistor 106 and the power transistor 122.

The reference current flowing through the bias circuitry 130 may vary with temperature, resulting in an undesirable performance variation over temperature. For example, the bias current (reference current) includes temperature dependencies that follow the following equations:

$$I_{cq} T^{5/2} \qquad \text{Equation 1}$$

$$I_{cq} T \qquad \text{Equation 2}$$

where I is the reference current, cq is the quiescent current at the collector of the reference transistor, indicates proportionality, and T is the temperature.

Therefore, there is a need in the industry for a temperature independent wireless power amplification bias circuit that allows the power amplifier to achieve highly efficient power amplification over a broad range of temperature variations and that is economical to produce in high volume.

SUMMARY

The invention provides a temperature stable bias circuit for an RF power amplifier. The bias circuitry uses current deletion and current supplement techniques to maintain the bias or reference current of the RF power amplifier at a stable level regardless of the temperature under which the power amplifier is operating. When temperature increases, the current deletion circuitry reduces the bias current supplied to the power transistor. When the temperature decreases, the current supplement circuitry increases the bias current supplied to the power transistor. The bias circuitry allows the output of the RF power amplifier to remain constant. The current deletion and current supplement circuitry can be fabricated using the same processing technology as the power amplifier and can be easily integrated into the power amplifier device packaging.

Related methods of operation and computer readable media are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention, as defined in the claims, can be better understood with reference to the following figures. The components within the figures are not necessarily to scale relative to each other, emphasis instead being placed upon clearly illustrating the principles of the invention. Moreover, in the figures, like reference numerals designate corresponding parts throughout the different views.

DETAILED DESCRIPTION

Figure 1:
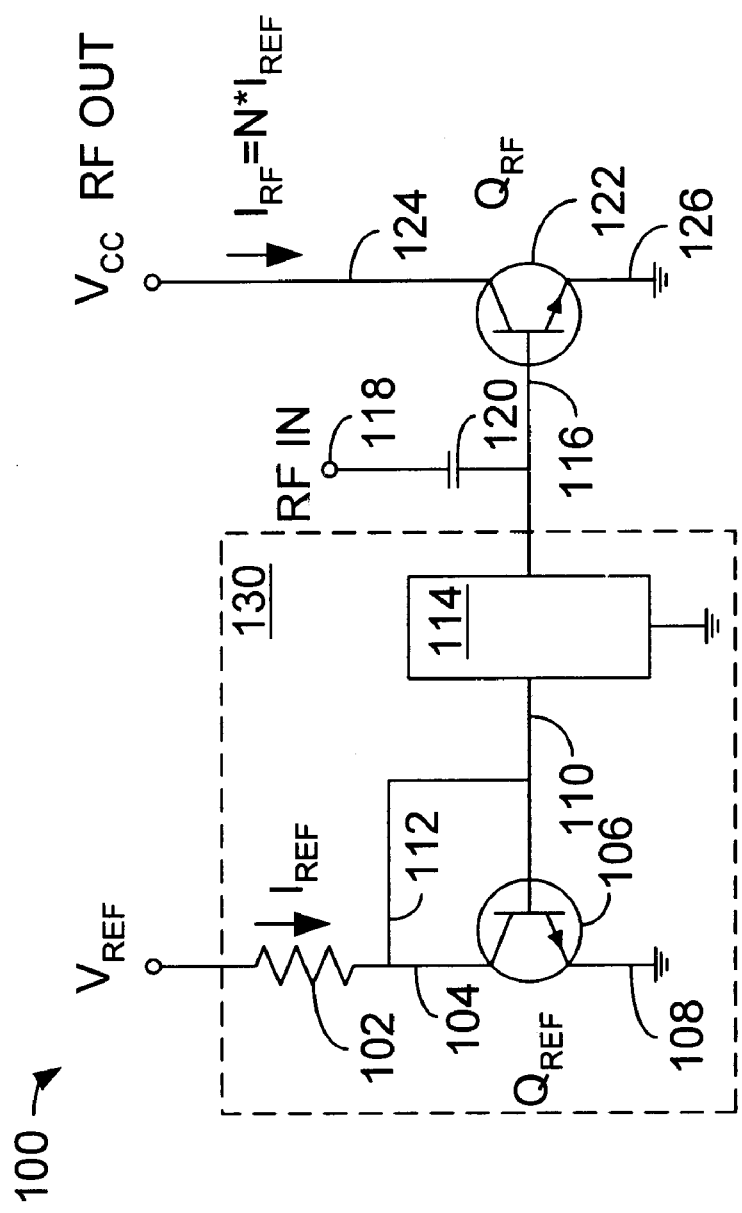
FIG. 1 is a schematic view illustrating a conventional bias circuit for a radio frequency (RF) power amplifier.

Although described with particular reference to a portable transceiver, the power amplifier circuit for providing constant bias current over a wide temperature range can be implemented in any power amplification system where it is desirable to have constant power amplification over wide temperature variations.

Furthermore, the power amplifier circuit for providing constant bias current over a wide temperature range can be implemented in software, hardware, or a combination of software and hardware. In a preferred embodiment(s), selected portions of the power amplifier circuit for providing constant bias current over a..wide temperature range are implemented in hardware and software. The hardware portion of the invention can be implemented using specialized hardware logic. The software portion can be stored in a memory and be executed by a suitable instruction execution system (microprocessor). The hardware implementation of the power amplifier circuit for providing constant bias current over a wide temperature range can include any or a combination of the following technologies, that are all well known in the art: a discrete logic circuit(s) having logic gates for implementing logic functions upon data signals, an application specific integrated circuit having appropriate logic gates, a programmable gate array(s) (PGA), a field programmable gate array (FPGA), etc.

Furthermore, the power amplifier circuit for providing constant bias current over a wide temperature range software, that comprises an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon that the program is printed, as the program can be electronically captured, via for instance optical scanning of the paper or other medium, then compiled, interpreted or otherwise processed in a suitable manner if necessary, and then stored in a computer memory.

Figure 2:
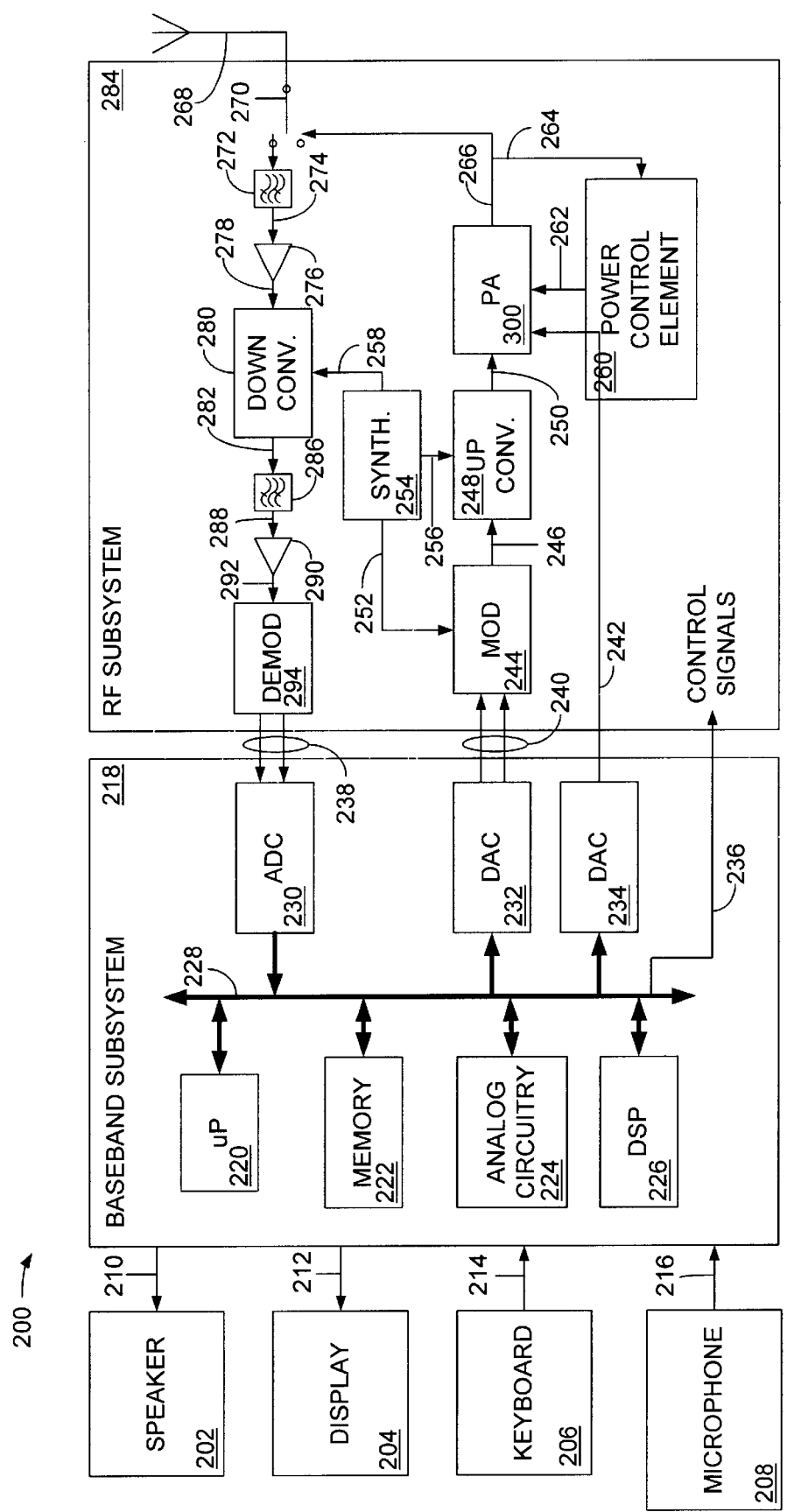
FIG. 2 is a block diagram illustrating a simplified portable transceiver.

FIG. 2 is a block diagram illustrating a simplified portable transceiver 200. Portable transceiver 200 includes speaker 202, display 204, keyboard 206, and microphone 208, all connected to baseband subsystem 218. In a particular embodiment, portable transceiver 200 can be, for example but not limited to, a portable telecommunication handset such as a mobile cellular-type telephone. Speaker 202 and display 204 receive signals from baseband subsystem 218 via connections 210 and 212, respectively, as known to those skilled in the art. Similarly, keyboard 206 and microphone 208 supply signals to baseband subsystem 218 via connections 214 and 214, respectively. Baseband subsystem 218 includes microprocessor ($\mu$P) 220, memory 222, analog circuitry 224, and digital signal processor (DSP) 226 in communication via bus 228. Bus 228, although shown as a single bus, may be implemented using multiple busses connected as necessary among the subsystems within baseband subsystem 218. Microprocessor 220 and memory 222 provide the signal timing, processing and storage functions for portable transceiver 200. Analog circuitry 224 provides the analog processing functions for the signals within baseband subsystem 218. Baseband subsystem 218 provides control signals to radio frequency (RF) subsystem 284 via connection 236. Although shown as a single connection 236, the control signals may originate from DSP 226 or from microprocessor 220, and are supplied to a variety of points within RF subsystem 284. It should be noted that, for simplicity, only the basic components of portable transceiver 200 are illustrated.

Baseband subsystem 218 also includes analog-to-digital converter (ADC) 230 and digital-to-analog converters (DACs) 232 and 234. ADC 230, DAC 232 and DAC 234 also communicate with microprocessor 220, memory 222, analog circuitry 224 and DSP 226 via bus 228. DAC 232 converts the digital communication information within baseband subsystem 218 into an analog signal for transmission to RF subsystem 284 via connection 240. DAC 234 provides a reference voltage power level signal to power amplifier 300 via connection 242. Connection 240, while shown as two directed arrows, includes the information that is to be transmitted by RF subsystem 284 after conversion from the digital domain to the analog domain.

RF subsystem 284 includes modulator 244, that after receiving a frequency reference signal, also called a local oscillator signal or LO from synthesizer 254 via connection 252, modulates the analog information on connection 240 and provides a modulated signal via connection 246 to upconverter 248. Upconverter 248 also receives a frequency reference signal from synthesizer 254 via connection 256. Synthesizer 254 determines the appropriate frequency that upconverter 248 will upconvert the modulated signal on connection 246. The modulated signal on connection 246 may be any modulated signal, such as a phase modulated signal or an amplitude modulated signal. Furthermore, it is possible to supply a phase modulated signal to upconverter 248 and to introduce an amplitude modulated signal component into power amplifier 300 through the power amplifier's control channel. All possible modulation techniques can benefit from the invention to be described below.

Upconverter 248 supplies the modulated signal via connection 250 to power amplifier 300. Power amplifier 300 amplifies the signal on connection 250 to a variety of different power levels while maintaining a high efficiency level. Power amplifier 300 amplifies the modulated signal on connection 250 to the appropriate power level for transmission via connection 266 to antenna 268. Illustratively, switch 270 controls whether the amplified signal on connection 266 is transferred to antenna 268 or whether a received signal from antenna 268 is supplied to filter 272. The operation of switch 270 is controlled by a control signal from baseband subsystem 218 via connection 236.

A portion of the amplified transmit signal energy on connection 266 is supplied via connection 264 to power control element 260. Power control element 260, forms a closed power control feedback loop and, if desired, supplies an AM component of the transmit signal via control channel connection 262 to power amplifier 300.

A signal received by antenna 268 will, at the appropriate time determined by baseband system 218, be directed via switch 270 to receive filter 272. Receive filter 272 will filter the received signal and supply the filtered signal on connection 274 to low noise amplifier (LNA) 276. Receive filter 272 is a bandpass filter, that passes all channels of the particular cellular system where the portable transceiver 200 is operating. As an example, in a 900 MHz GSM system, receive filter 272 would pass all frequencies from 935.1 MHz to 959.9 MHz, covering all 124 contiguous channels of 200 kHz each. The purpose of this filter is to reject all frequencies outside the desired region. LNA 276 amplifies the very weak signal on connection 274 to a level that the downconverter 280 can translate the signal from the transmitted frequency back to a baseband frequency. Alternatively, the functionality of LNA 276 and downconverter 280 can be accomplished using other elements, such as for example but not limited to, a low noise block downconverter (LNB).

Downconverter 280 receives a frequency reference signal, also called a local oscillator signal or LO from synthesizer 254, via connection 258. This LO signal instructs the downconverter 280 as to the proper frequency in order to downconvert the signal received from LNA 276 via connection 278. The downconverted frequency is called the intermediate frequency or "IF". Downconverter 280 sends the downconverted signal via connection 282 to channel filter 286, also called the "IF filter." Channel filter 286 filters the downconverted signal and supplies it via connection 288 to amplifier 290. The channel filter 286 selects the one desired channel and rejects all others. Using the GSM system as an example, only one of the 124 contiguous channels is actually to be received. After all channels are passed by receive filter 272 and downconverted in frequency by downconverter 280, only the one desired channel will appear precisely at the center frequency of channel filter 286. The synthesizer 254, by controlling the local oscillator frequency supplied on connection 258 to downconverter 280, determines the selected channel. Amplifier 290 amplifies the received signal and supplies the amplified signal via connection 292 to demodulator 294. Demodulator 294 recovers the transmitted analog information and supplies a signal representing this information via connection 238 to ADC 230. ADC 230 converts these analog signals to a digital signal at baseband frequency and transfers it via bus 228 to DSP 226 for further processing.

Figure 3:
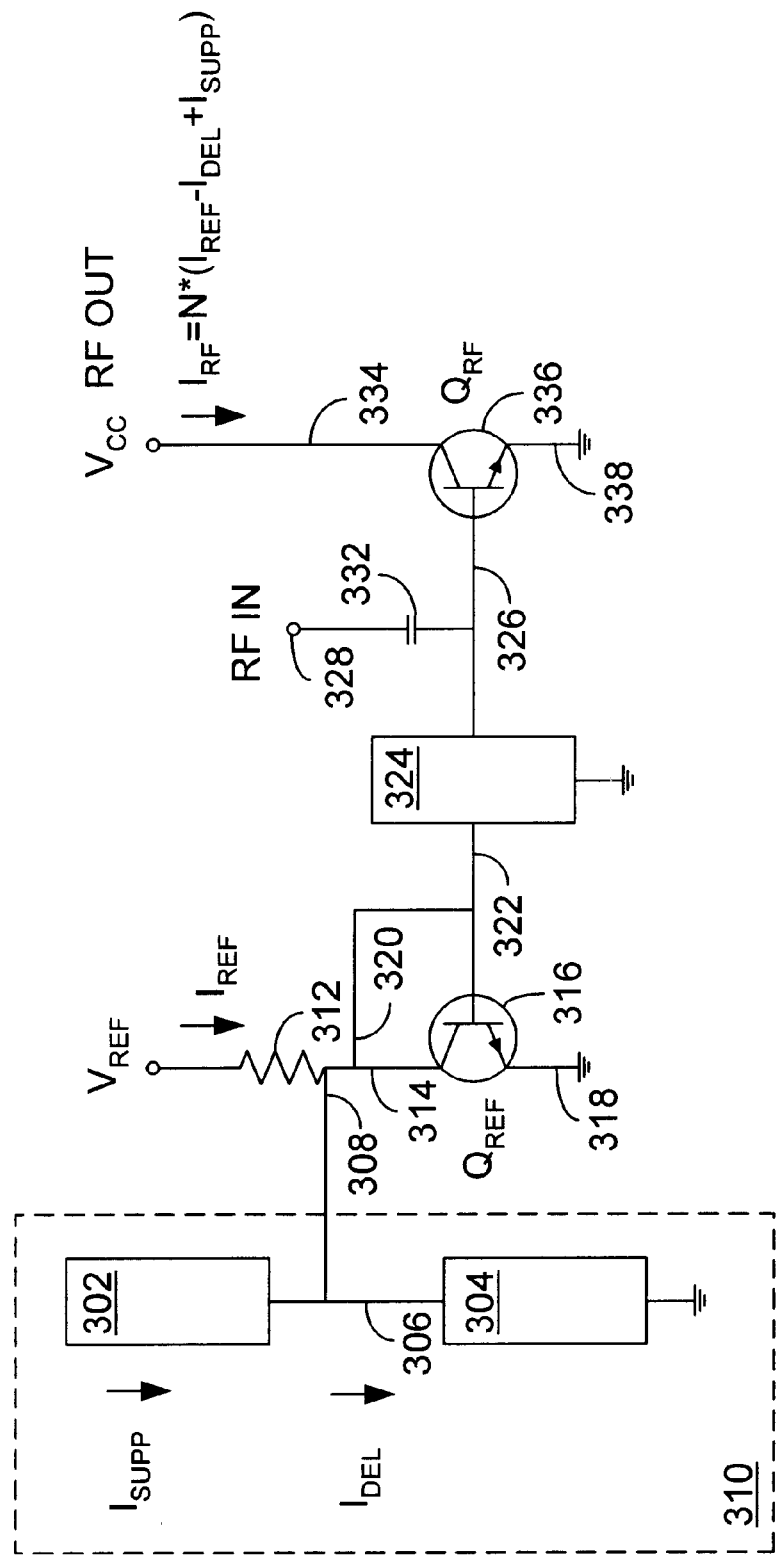
FIG. 3 is a schematic view illustrating the power amplifier of FIG. 2.

FIG. 3 is a schematic view illustrating the power amplifier 300 of FIG. 2. Power amplifier 300 includes current compensation circuitry 310 that includes current supplement circuitry 302 and current deletion circuitry 304. Current supplement circuitry 302 provides the current referenced as $I_{SUPP}$ and current deletion circuitry 304 provides the current referenced as $I_{DEL}$. Current compensation circuitry 310 operates to control the reference current $I_{REF}$ flowing through reference transistor 316 depending upon temperature increases or decreases. For example, when temperature increases, current deletion circuitry 304 allows a current $I_{DEL}$ to flow from connection 308 (the collector terminal of reference transistor 316) through connection 306 and through the current deletion circuitry 304 to ground. In this manner, the reference current $I_{REF}$ is reduced when temperature increases. Conversely, when temperature decreases, current supplement circuitry 302 causes the current labeled $I_{SUPP}$ to flow through the current supplement circuitry 302 through connection 308 and thus through reference transistor 316, thus increasing the reference current $I_{REF}$ when temperature decreases. In this manner, the bias current ($I_{REF}$) applied through buffer circuitry 324 to the base terminal 326 of power transistor 336 remains constant over a wide range of temperature variances.

Current compensation circuitry 310 connects to reference node 308 and thus connects to the collector terminal 314 of the reference transistor 316. A reference voltage referred to as $V_{REF}$ is applied to resistor 312 connected to the collector terminal 314 of reference transistor 316. This reference voltage causes the reference current $I_{REF}$ to flow through the reference transistor 316, thus applying the reference current to the base terminal 322 of reference transistor 316.

Buffer circuitry 324 is connected between the base terminal 322 of reference transistor 316 and the base terminal 326 of power transistor 336. Buffer circuitry 324 includes additional circuitry, as known to those have ordinary skill in the art, that multiplies the reference current on connection 322 to a level that can sufficiently bias the base terminal 326 of the power transistor 336. The buffer circuitry 324 also includes circuitry designed to prevent the leakage of RF energy from the RF input node 328 back into the reference transistor 316. The RF input signal labeled "RF IN" is supplied via node 328 through capacitor 332 to the base terminal 326 of power transistor 336. The current flowing through the collector terminal 334, through power transistor 336 and through the emitter terminal 338 to ground is the "RF OUT" signal and can be defined using the equation $I_{RF}=N*(I_{REF}-I_{DEL}+I_{SUPP})$.

Through the operation of the current compensation circuitry 310, the reference current appearing at the collector terminal 334 of power transistor 336 will remain constant over temperature variations due to the current added to the base terminal 326 by current supplement circuitry 302 and the current deleted from the base terminal 326 through the operation of current deletion circuitry 304. The voltage at the base terminal 326 of the power transistor 336 varies over temperature. However, by applying a constant reference current, the bias current of the power transistor 336 remains constant over a wide temperature range while the voltage at the base terminal 326 varies. By maintaining the current at the collector terminal 334 at a constant level, the efficiency of the power transistor 336 is significantly improved over a wide temperature range and the performance of the power transistor 336 improves over a wide temperature range. It should be understood that the connections illustrated with respect to FIG. 3 are merely one manner of connecting the power amplifier circuit 300. Furthermore, although illustrated using npn bipolar junction transistors, other implementations are possible. For example, pnp bipolar transistors, and field effect transistors (FETs) using complementary metal oxide semiconductor (CMOS), metal-semiconductor field effect transistor (MESFET), and pseudomorphic high electron mobility transistor (pHEMT) technology may be used. Those having ordinary skill in the art will recognize that many other circuit connections are possible to achieve the temperature stable bias (reference) current as described.

Figures 4, 5:
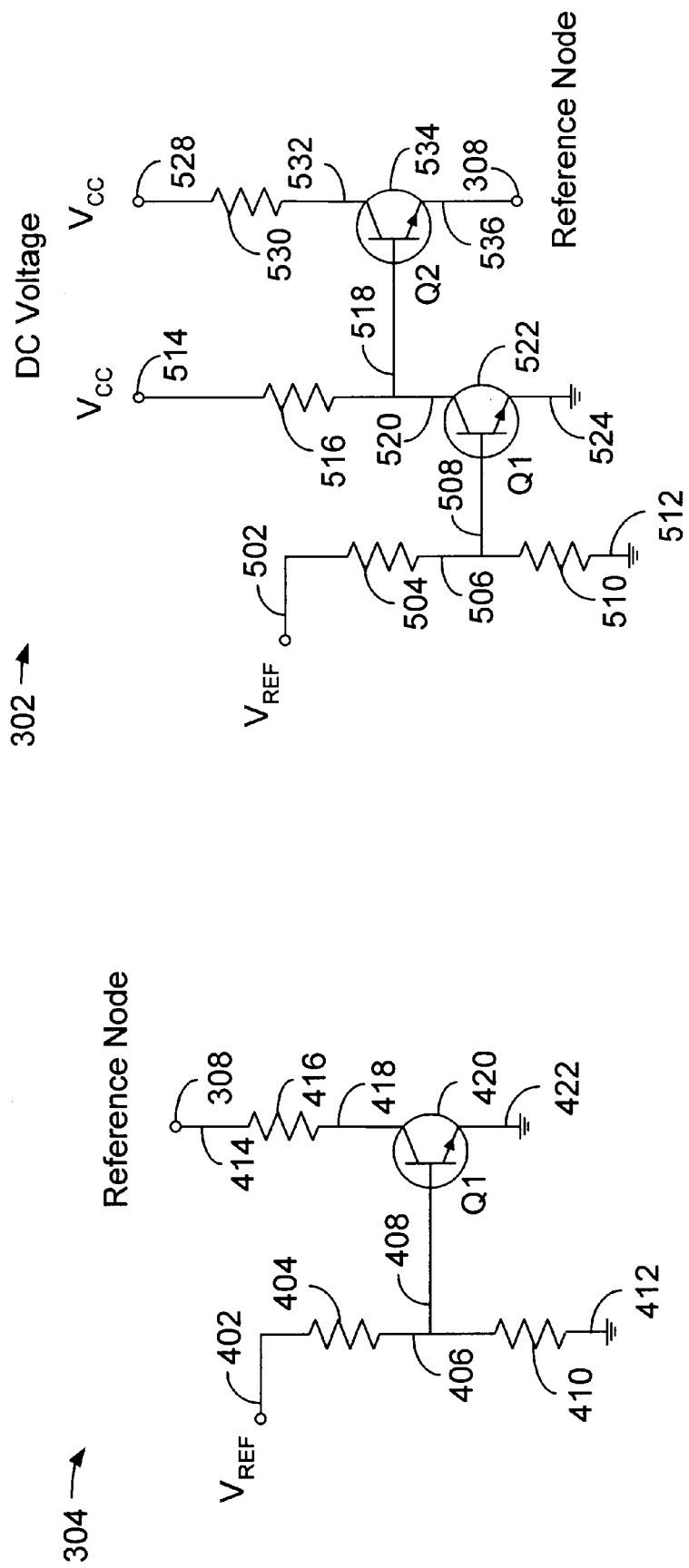
FIG. 4 is a schematic view illustrating the current deletion circuitry of FIG. 3.
FIG. 5 is a schematic view illustrating the current supplement circuitry of FIG. 3.

FIG. 4 is a schematic view illustrating the current deletion circuitry 304 of FIG. 3. A reference voltage $V_{REF}$ is supplied via node 402 through a voltage divider formed by resistors 404 and 410 to the base terminal 408 of deletion transistor 420. In this manner, the base voltage of deletion transistor 420 is set to a predetermined, stable value. The reference node 308 connects through resistor 416 to the collector terminal 418 of deletion transistor 420 and is also connected to the collector terminal 314 of the reference transistor 316 of FIG. 3. The current that flows through deletion transistor 420 will vary with respect to temperature. The base voltage applied to the base terminal 408 of deletion transistor 420 is set such that at high temperatures, the current that flows through deletion transistor 420 will be high as well. In this manner, the deletion transistor 420 activates at high temperatures, thus allowing more current to flow through it. When the current flow through the deletion transistor 420 increases, more current flows from the reference node 308 through the deletion transistor 420 to ground 422. In this manner, as temperature increases, the reference current $I_{REF}$ (FIG. 3) that is applied to the base terminal 326 of power transistor 336 (FIG. 3) is reduced. As temperature increases the collector current flowing through the reference transistor 316 ($Q_{REF}$) is reduced and the bias current of $Q_{RF}$ is reduced as a result.

As temperature decreases, the current flowing through deletion transistor 420 reduces, and eventually inactivates at a predefined temperature. In this manner, as temperature decreases, the current flow through deletion transistor 420 eventually ceases. In this manner, at high temperatures, current is deleted from the reference current flowing through the reference transistor 316 of FIG. 3.

FIG. 5 is a schematic view illustrating the current supplement circuitry 302 of FIG. 3. A reference voltage $V_{REF}$ is applied to terminal 502 through the voltage divider formed by resistors 504 and 510 and to the base terminal 508 of first supplement transistor 522. This arrangement is similar to that described above with respect to deletion transistor 420 of FIG. 4. A DC voltage referred to as $V_{CC}$ is applied to terminal 514, through resistor 516 to the collector terminal 520 of first supplement transistor 522. As mentioned above with respect to FIG. 4, as temperature increases the current flowing through first supplement transistor 522 will increase, thus applying a high current to the collector terminal 520 of first supplement transistor 522. The high current at collector terminal 520 of first supplement transistor 522 reduces the voltage present at the collector terminal 520 of first supplement transistor 522. In this mainer, the second supplement transistor 534 is turned off, thus preventing any current from flowing through the second supplement transistor 534.

As the temperature decreases, the current flowing through first supplement transistor 522 also drops, thus causing the voltage present at the collector terminal 520 of first supplement transistor 522 to increase. This increased voltage is also present at the base terminal 518 of second supplement transistor 534, thus causing the second supplement transistor 534 to begin conducting current from terminal 528 connected to $V_{CC}$ through the second supplement transistor 534 and to the reference node 308. The reference node 308 is connected to the emitter terminal 536 of second supplement transistor 534. Current flowing through the reference node 308 is added to, or supplements, the reference current $I_{REF}$ flowing through reference transistor 316 of FIG. 3. In this manner, when system temperature decreases, and the reference current applied to the base terminal 326 of power transistor 336 of FIG. 3 begins decreasing, the current supplement circuitry 302 adds, or supplements the reference current $I_{REF}$ by providing additional current flow through second supplement transistor 534 into the reference node 308.

The current compensation circuitry 310 allows the current that flows through reference transistor 316 of FIG. 3 to remain constant, thus maintaining a constant bias voltage and current at the base terminal 326 of power transistor 336. In this manner, the power transistor 336 can maintain a constant power amplification profile over a wide temperature range. Furthermore, characteristics such as gain, power added efficiency, and linearity of power amplifier 300 can be greatly enhanced over a wide range of operating temperatures. Further still, any extra current consumption incurred through the operation of the current supplement circuitry 302 is negligible when compared with the total current consumption of the power amplifier 300 because the reference current is merely a small fraction of the current consumed by the power transistor 336. Moreover, the current supplement circuitry 302 and the current deletion circuitry 304 can be fabricated on the same semiconductor die as that of power transistor 336 and bias circuitry 130 and consume a limited amount of space. The use of field effect transistors and/or npn bipolar transistors to implement the current compensation circuitry 310 reduces the DC voltage requirement significantly.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A method for regulating bias current in a power amplifier, comprising:

supplying a reference current to the power amplifier; and maintaining the reference current at a predefined level to prevent fluctuation of the reference current with temperature variations, by increasing the reference current when the temperature drops.

2. A temperature stabilized bias circuit for a radio frequency power amplifier, comprising:

a reference amplifier configured to supply a reference current;

a power amplifier coupled to the reference amplifier and configured to receive the reference current; and current compensation circuitry coupled to the reference amplifier and configured to maintain the reference current at a predefined level, wherein the current compensation circuitry further comprises:

first circuitry configured to reduce the reference current when temperature increases; and second circuitry configured to increase the reference current when temperature decreases.

3. The bias circuit of claim 2, wherein the first circuitry comprises a first amplifier having a collector terminal coupled to the power amplifier and having a base terminal coupled to a reference voltage through a voltage divider, wherein a current at the collector terminal increases as temperature increases.

4. The bias circuit of claim 2, wherein the second circuitry comprises:

a first amplifier having a base terminal coupled to a reference voltage through a voltage divider; and a second amplifier having a base terminal coupled to the collector of the first amplifier, the second amplifier also having an emitter terminal coupled to the power amplifier, where a current at the emitter terminal of the second amplifier increases as temperature decreases.

5. A temperature stabilized bias circuit for a radio frequency power amplifier, comprising:

means for supplying a reference current to the power amplifier; and means for maintaining the reference current at a predefined level to prevent fluctuation of the reference current with temperature variations, by increasing the reference current when the temperature drops.

6. A computer readable medium having a program for regulating bias current in a power amplifier, the program comprising logic for performing the steps of:

supplying a reference current to the power amplifier; and maintaining the reference current at a predefined level to prevent fluctuation of the reference current with temperature variations, by increasing the reference current when the temperature drops.

7. A method for regulating bias current in a power amplifier, comprising:

supplying a reference current to the power amplifier; and maintaining the reference current at a predefined level to prevent fluctuation of the reference current with temperature variations, by decreasing the reference current when the temperature increases.

8. A temperature stabilized bias circuit for a radio frequency power amplifier, comprising:

means for supplying a reference current to the power amplifier;

means for maintaining the reference current at a predefined level to prevent fluctuation of the reference current with temperature variations, by decreasing the reference current when the temperature increases.

9. A computer readable medium having a program for regulating bias current in a power amplifier, the program comprising logic for performing the steps of:

supplying a reference current to the power amplifier; and maintaining the reference current at a predefined level to prevent fluctuation of the reference current with temperature variations, by decreasing the reference current when the temperature increases.

* * * * *